(12) United States Patent
Mizumura

(10) Patent No.: US 9,030,646 B2
(45) Date of Patent: May 12, 2015

(54) EXPOSURE APPARATUS AND PHOTOMASK USED THEREIN

(75) Inventor: Michinobu Mizumura, Yokohama (JP)

(73) Assignee: V Technology Co., Ltd., Yokohama-shi (JP)

( * ) Notice: Subject to any disclaimer, the term of this patent is extended or adjusted under 35 U.S.C. 154(b) by 224 days.

(21) Appl. No.: 13/467,582

(22) Filed: May 9, 2012

(65) Prior Publication Data

US 2012/0218537 A1    Aug. 30, 2012

Related U.S. Application Data

(63) Continuation of application No. PCT/JP2009/069288, filed on Nov. 12, 2009.

(51) Int. Cl.
*G03F 1/00* (2012.01)
*G03F 7/20* (2006.01)
*G03F 1/38* (2012.01)

(52) U.S. Cl.
CPC .............. *G03F 1/14* (2013.01); *G03F 7/70275* (2013.01); *G03F 1/38* (2013.01); *G03F 7/70283* (2013.01); *G03F 7/7035* (2013.01)

(58) Field of Classification Search
CPC ......... G03F 1/00; G03F 1/14; G03F 7/70075; G03F 7/70216; G03F 7/70275; G03F 7/70283; G03F 7/703; G03F 7/7035; G03F 1/38
USPC ............... 355/53, 67, 71, 77; 430/5
See application file for complete search history.

(56) References Cited

U.S. PATENT DOCUMENTS

| | | | | |
|---|---|---|---|---|
| 5,517,279 | A | * 5/1996 | Hugle et al. | 355/46 |
| 6,016,185 | A | * 1/2000 | Cullman et al. | 355/52 |
| 6,133,986 | A | 10/2000 | Johnson | |
| 6,335,783 | B1 | 1/2002 | Kruit | |

(Continued)

FOREIGN PATENT DOCUMENTS

| | | |
|---|---|---|
| CN | 1871552 A | 11/2006 |
| JP | 03-020733 | 1/1991 |
| JP | 06-148861 | 5/1994 |

(Continued)

OTHER PUBLICATIONS

First Office Action mailed Dec. 9, 2013 in Chinese patent application No. 200980162367.0. (8 pages.).

(Continued)

*Primary Examiner* — Colin Kreutzer
(74) *Attorney, Agent, or Firm* — Finnegan, Henderson, Farabow, Garrett & Dunner, L.L.P.

(57) ABSTRACT

In an exposure apparatus, a photomask 3 is provided with a plurality of mask pattern columns 15 formed by arranging a plurality of mask patterns 13 at a predetermined pitch in a direction substantially orthogonal to a conveying direction A of an object to be exposed and a plurality of microlenses 14 formed on a side of the object to be exposed corresponding to the mask patterns 13 to project reduced mask patterns 13 on the object to be exposed The photomask 3 is obtained by forming subsequent mask pattern columns 15*b* to 15*d* and the microlenses 14 corresponding to them so as to be shifted by a predetermined dimension in an arranging direction of a plurality of mask patterns 13 from a mask pattern column 15*a* located downstream in the conveying direction A of the object to be exposed.

6 Claims, 7 Drawing Sheets

(56) References Cited

U.S. PATENT DOCUMENTS

| | | |
|---|---|---|
| 2011/0194095 A1* | 8/2011 | Mizumura ............... 355/74 |
| 2012/0212717 A1* | 8/2012 | Hatanaka ............... 355/53 |

FOREIGN PATENT DOCUMENTS

| | | |
|---|---|---|
| JP | 08-008164 | 1/1996 |
| JP | 2001-500628 | 1/2001 |
| JP | 2001-509967 | 7/2001 |
| JP | 2007-133428 A | 5/2007 |
| JP | 2008-076709 | 4/2008 |
| TW | 200600981 | 1/2006 |
| WO | PCT/JP2009/069288 | 11/2009 |

OTHER PUBLICATIONS

English-language translation of International Search Report from the Japanese Patent Office for International Application No. PCT/JP2009/069288, mailing date Dec. 8, 2009.

Japanese Office Action corresponding to counterpart Japanese Patent Application No. 2008-212386 mailed Sep. 25, 2012.

* cited by examiner

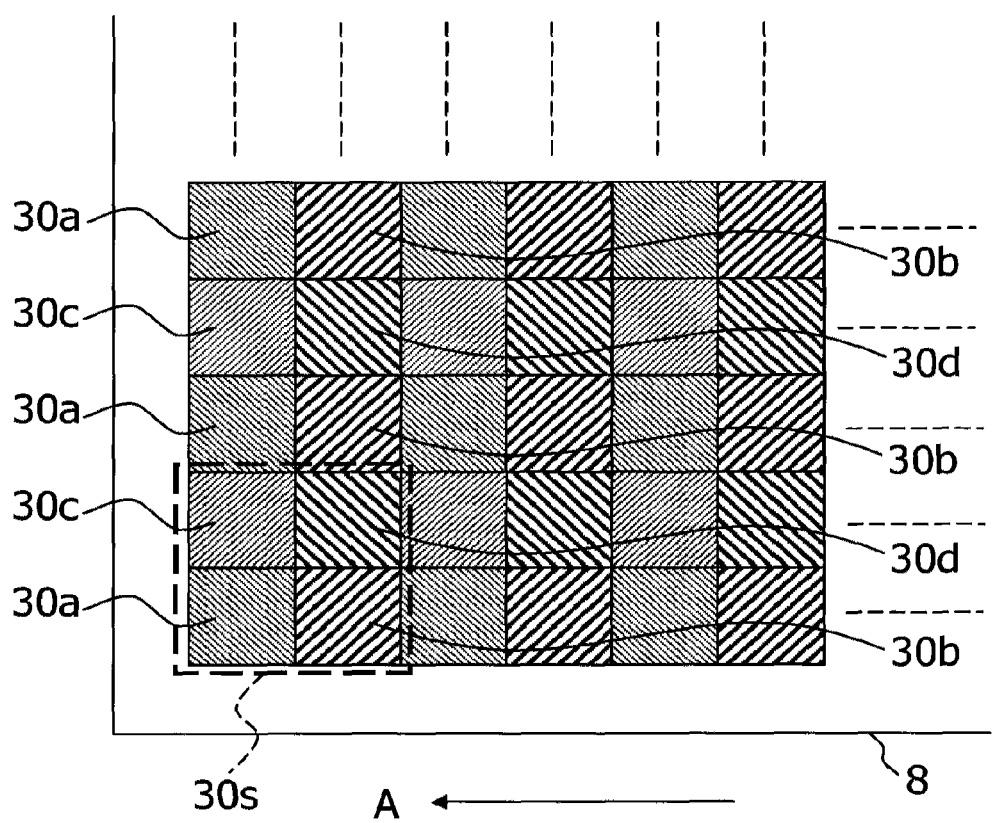

EXPOSURE APPARATUS AND PHOTOMASK USED THEREIN

This application is a continuation of PCT/JP2009/069288, filed on Nov. 12, 2009.

BACKGROUND OF THE INVENTION

1. Field of the Invention

The present invention relates to an exposure apparatus, which forms an exposure pattern by intermittently applying exposure light to an object to be exposed while conveying the object to be exposed in one direction, and in particular, relates to the exposure apparatus, which forms minute exposure patterns on an entire surface of the object to be exposed at high resolution and at high density, and a photomask used therein.

2. Description of Related Art

A conventional exposure apparatus is the exposure apparatus, which performs exposure of a mask pattern of the photo mask on a predetermined position by intermittently applying the exposure light to the object to be exposed conveyed at a constant speed through the photomask, and a position upstream of an exposure position by the photo mask in a conveying direction of the object to be exposed is captured by imaging device, takes an alignment between the object to be exposed and the photomask based on an imaged image and controls applying timing of the exposure light (for example, refer to Japanese Laid-Open Patent Application No. 2008-76709).

However, such conventional exposure apparatus directly transfers an image of the mask pattern formed on the photomask by the exposure light, which perpendicularly passes through the photomask, on the object to be exposed, so that, due to presence of collimation half angle of light applied to the photomask, an image of the pattern on the object to be exposed is blurred and resolution is deteriorated, and there is a possibility that the minute pattern may not be formed by exposure.

Although it is possible to deal with such a problem by providing a microlens corresponding to the mask pattern on a side of the object to be exposed of the photomask and projecting a reduced mask pattern on the object to be exposed, in this case, there is a problem that it is not possible to form the exposure pattern on a portion between the lenses adjacently arranged in a direction substantially orthogonal to the conveying direction of the object to be exposed and it is not possible to form the minute exposure patterns on the entire surface of the object to be exposed at high density.

SUMMARY OF THE INVENTION

Therefore, in view of the above conventional problems, an object of the present invention is to provide an exposure apparatus, which forms the minute exposure patterns on the entire surface of an object to be exposed at high resolution and at high density, and a photomask used therein.

In order to achieve the above-described object, an exposure apparatus according to an aspect of the present invention is an exposure apparatus, which forms an exposure pattern on an object to be exposed corresponding to a plurality of mask patterns formed on a photomask by intermittently applying exposure light to the object to be exposed through the photomask while conveying the object to be exposed in one direction. The photomask is provided with a plurality of mask pattern columns formed by arranging the plurality of mask patterns at a predetermined pitch in a direction substantially orthogonal to a conveying direction of the object to be exposed and a plurality of microlenses formed on a side of the object to be exposed corresponding to the mask patterns of the plurality of mask pattern columns to project reduced mask patterns on the object to be exposed, in which a subsequent mask pattern column and the microlenses corresponding to the column are formed so as to be shifted by a predetermined dimension in an arranging direction of the plurality of mask patterns such that it is possible to perform exposure by complementing a space between a plurality of exposure patterns formed by the mask pattern column located downstream in the conveying direction of the object to be exposed with a plurality of exposure patterns formed by the subsequent mask pattern column.

By such a configuration, the exposure pattern is formed on the object to be exposed corresponding to a plurality of mask patterns formed on the photomask by intermittently applying the exposure light to the object to be exposed through the photomask while conveying the object to be exposed in one direction. The photomask is provided with a plurality of mask pattern columns formed by arranging a plurality of mask patterns at a predetermined pitch in the direction substantially orthogonal to the conveying direction of the object to be exposed and a plurality of microlenses formed on a side of the object to be exposed corresponding to the mask patterns of a plurality of mask pattern columns to project reduced mask patterns on the object to be exposed, in which the subsequent mask pattern column and the microlenses corresponding to the same are formed so as to be shifted by a predetermined dimension in the arranging direction of a plurality of mask patterns such that it is possible to perform the exposure by complementing the space between a plurality of exposure patterns formed by the mask pattern column located downstream in the conveying direction of the object to be exposed with a plurality of exposure patterns formed by the subsequent mask pattern column.

Preferably, the subsequent mask pattern column and the microlenses corresponding to the column are formed so as to be shifted in the arranging direction by a dimension equal to an integral multiple of a width corresponding to the arranging direction of a plurality of mask patterns in a projection image of the mask patterns on the object to be exposed.

Also, a photomask according to an aspect of the present invention is a photomask used in an exposure apparatus which forms an exposure pattern by intermittently applying exposure light to an object to be exposed while conveying the object to be exposed in one direction, including: a plurality of mask pattern columns formed by arranging a plurality of mask patterns at a predetermined pitch in a direction substantially orthogonal to a conveying direction of the object to be exposed; and a plurality of microlenses formed on a side of the object to be exposed corresponding to the mask patterns of the plurality of mask pattern columns to project reduced mask patterns on the object to be exposed, in which a subsequent mask pattern column and the microlenses corresponding to the column are formed so as to be shifted by a predetermined dimension in an arranging direction of the plurality of mask patterns such that it is possible to perform exposure by complementing a space between a plurality of exposure patterns formed by the mask pattern column located downstream in the conveying direction of the object to be exposed with a plurality of exposure patterns formed by the subsequent mask pattern column.

By such a configuration, the exposure pattern is formed by intermittently applying the exposure light to the object to be exposed while conveying the object to be exposed in one direction by using the photomask. The photomask is provided with a plurality of mask pattern columns formed by arranging a plurality of mask patterns at a predetermined pitch in the direction substantially orthogonal to the conveying direction of the object to be exposed and a plurality of microlenses formed on the side of the object to be exposed corresponding to the mask patterns of a plurality of mask pattern columns to project the reduced mask patterns on the object to be exposed, in which the subsequent mask pattern column and the microlenses corresponding to the column are formed so as to be shifted by a predetermined dimension in the arranging direction of a plurality of mask patterns such that it is possible to perform the exposure by complementing the space between a plurality of exposure patterns formed by the mask pattern column located downstream in the conveying direction of the object to be exposed with a plurality of exposure patterns formed by the subsequent mask pattern column.

Preferably, the subsequent mask pattern column and the microlenses corresponding to the column are formed so as to be shifted in the arranging direction by a dimension equal to an integral multiple of a width corresponding to the arranging direction of the plurality of mask patterns in a projection image of the mask patterns on the object to be exposed.

More preferably, the plurality of mask patterns are formed on one surface of a transparent substrate and the plurality of microlenses are formed on the other surface of the transparent substrate.

Furthermore, it may be formed by stacking a substrate for mask on one surface of which the plurality of mask patterns are formed on and a substrate for lens on one surface of which the plurality of microlenses are formed such that the plurality of mask patterns and the plurality of microlenses correspond to each other.

According to a first aspect and a third aspect of the invention, a plurality of microlenses, which project the reduced mask patterns on the object to be exposed, are provided on the side of the object to be exposed corresponding to the mask patterns, so that it is possible to form the minute exposure pattern at high resolution. Furthermore, the mask pattern column behind the mask pattern column located downstream in the conveying direction of the object to be exposed and the microlenses corresponding thereto are formed so as to be shifted by a predetermined dimension in the arranging direction of a plurality of mask patterns, so that it is possible to perform the exposure by complementing the space between a plurality of exposure patterns formed by the mask pattern column located downstream in the conveying direction of the object to be exposed with a plurality of exposure patterns formed by the subsequent mask pattern column. Therefore, it is possible to form the exposure patterns on the entire surface of the object to be exposed at high density.

Furthermore, according to a second aspect and a fourth aspect of the invention, it is possible to form the exposure patterns at higher density.

Furthermore, according to a fifth aspect of the invention, the mask pattern and the microlens are formed on the same transparent substrate in an integrated manner, so that position alignment of the mask pattern and the microlens is not necessary. Therefore, the photomask may be easily handled.

Then, according to a sixth aspect of the invention, a plurality of mask patterns and a plurality of microlenses are formed on the different substrates, so that, in a case in which there is a defect in the mask pattern or design thereof is changed with the same pitch, it is only necessary to change the substrate for mask on which the mask patterns are formed. Therefore, it is possible to inhibit increase in cost of the photomask.

BRIEF DESCRIPTION OF THE DRAWINGS

FIGS. 2A to 2C are views illustrating a configuration of a photomask used in the exposure apparatus according to the present invention, in which FIG. 2A is a plane view, FIG. 2B is a side view, and FIG. 2C is a bottom view.

FIG. 7 is a plane view schematically illustrating the exposure pattern formed by using the photomask in FIG. 6.

DESCRIPTION OF THE PREFERRED EMBODIMENTS

Figure 1:
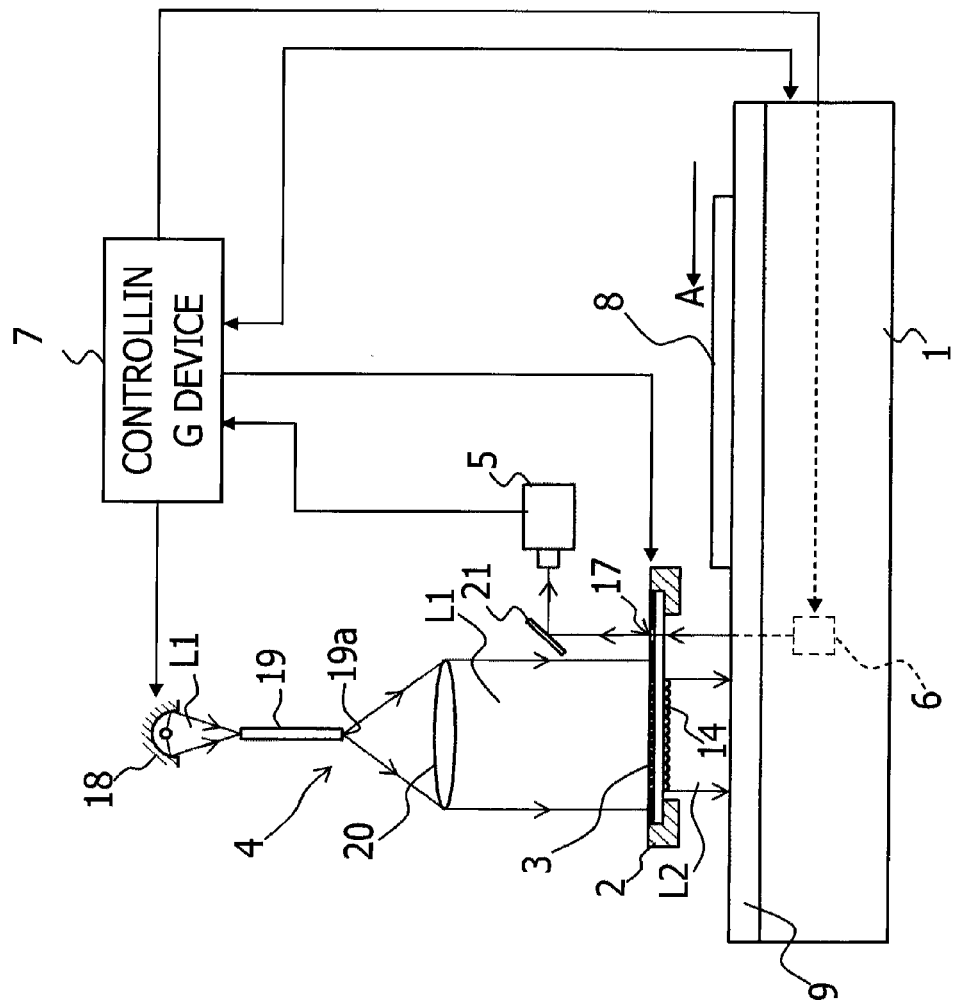
FIG. 1 is a schematic configuration diagram illustrating an embodiment of an exposure apparatus according to the present invention.

An embodiment of the present invention is hereinafter described in detail with reference to the attached drawings. FIG. 1 is a schematic configuration diagram illustrating the embodiment of an exposure apparatus according to the present invention. The exposure apparatus is configured to form an exposure pattern by intermittently applying exposure light to an object to be exposed while conveying the object to be exposed in one direction and is provided with conveying device 1, a mask stage 2, a photomask 3, an exposure optical system 4, imaging device 5, illuminating device 6, and controlling device 7. Meanwhile, the object to be exposed 8 herein used is obtained by repeatedly forming functional patterns having a predetermined shape such as a thin-film transistor of a TFT substrate, on one surface of a transparent substrate so as to have predetermined relationship.

The conveying device 1 is configured that the object to be exposed 8 is placed on an upper surface of a stage 9 and conveyed in one direction (arrow A direction) at a predetermined speed, and this conveying device 1 moves the stage 9 by a moving mechanism with combination of a motor, a gear and the like, for example. Furthermore, on the conveying device 1, a speed sensor for measuring a moving speed of the stage 9 and a position sensor (not illustrated) for measuring a moving distance of the stage 9 are provided.

Figure 2:
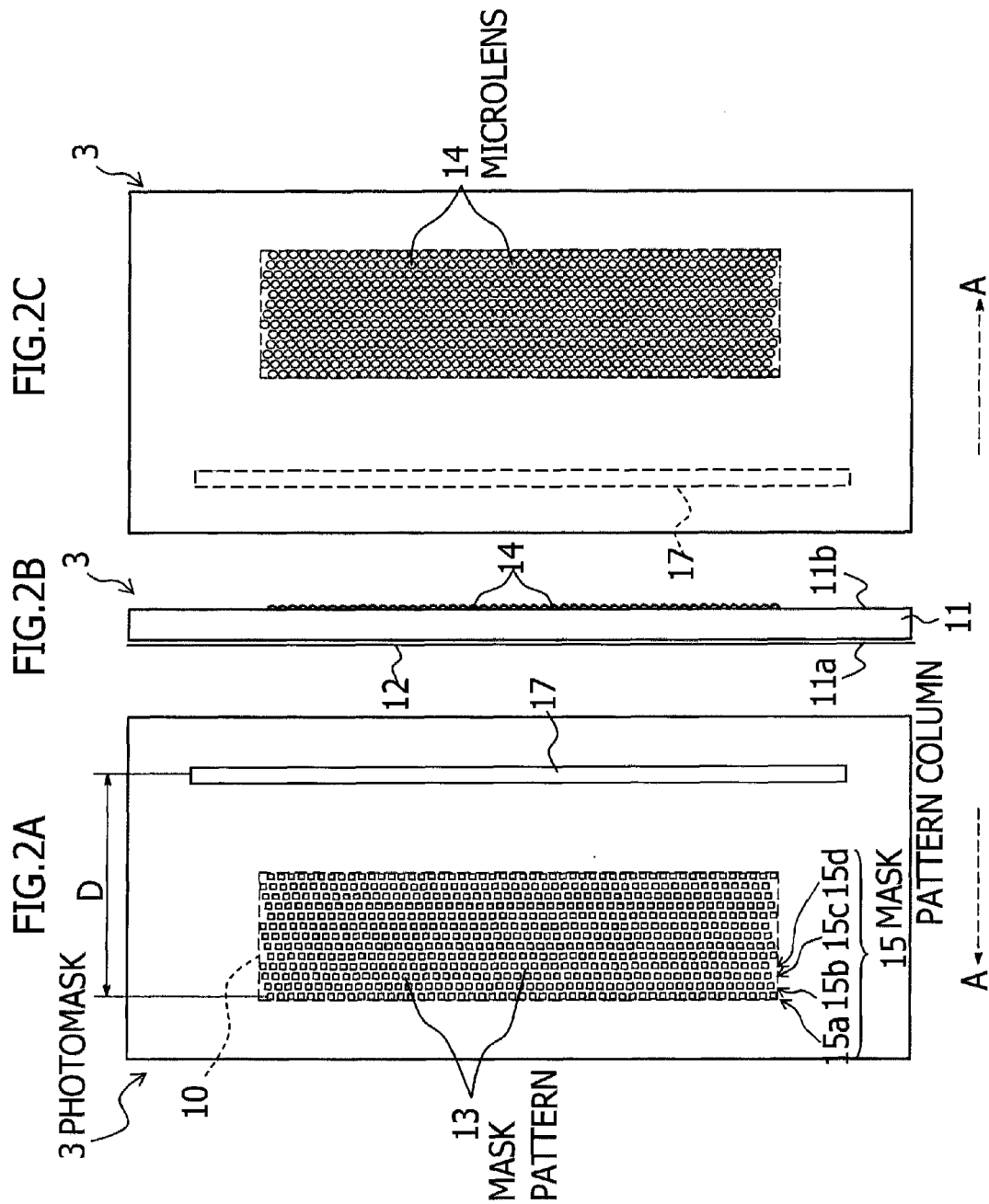

The mask stage 2 is provided above the conveying device 1. The mask stage 2 is configured to be disposed proximately and oppositely to the object to be exposed 8 which is placed on the conveying device 1 to be conveyed, and to hold the photomask 3 to be described later. The central portion of the mask stage 2 is opened so as to correspond to an area of the photomask 3 including a forming area 10 of the mask pattern 13 and an eyehole 17 (refer to FIG. 2), and the mask stage 2 may hold a peripheral portion of the photomask 3. The mask stage 2 is formed so as to be movable with the imaging device 5 to be described later in an integrated manner in a direction substantially orthogonal to a conveying direction indicated by an allow A of the object to be exposed 8 in a plane parallel to a surface of the stage 9. Furthermore, the mask stage 2 may also be formed so as to be rotatable around a center thereof within a predetermined angular range as needed.

The photomask 3 is detachably held by the mask stage 2. The photomask 3 is obtained by forming a plurality of mask patterns having a shape similar to that of the exposure pattern formed on the object to be exposed 8. In a state of being held on the mask stage 2, the photomask 3 is provided with a plurality of mask pattern columns formed by arranging a plurality of mask patterns at a predetermined pitch in the direction substantially orthogonal to the conveying direction of the object to be exposed 8 and a plurality of microlenses formed on a side of the object to be exposed 8 so as to correspond to the mask patterns of a plurality of mask pattern columns to project reduced mask patterns on the object to be exposed 8, in which a subsequent mask pattern columns and the microlenses corresponding to the columns are formed so as to be shifted by a predetermined dimension in an arranging direction of a plurality of mask patterns (direction substantially orthogonal to the conveying direction of the object to be exposed 8) such that it is possible to perform exposure by complementing a space between a plurality of exposure patterns formed by the mask pattern column located downstream in the conveying direction of the object to be exposed 8 with a plurality of exposure patterns formed by the subsequent mask pattern column.

Specifically, as illustrated in FIG. 2B, in the photomask 3, an opaque chrome (Cr) film 12 is formed on one surface 11a of a transparent substrate 11 made of quartz, for example, and a plurality of mask patterns 13 having an opening with a predetermined shape in the pattern forming area 10 indicated by a broken line in FIG. 2A is formed on the chrome (Cr) film 12. Meanwhile, in FIG. 2A, the mask pattern 13 is indicated in a simplified manner by a square corresponding to an outer shape thereof in order to avoid the drawing from being complicated. Furthermore, as illustrated in FIG. 2C, on the other surface 11b of the transparent substrate 11, a plurality of microlenses 14 having a magnification of 0.25 and a focal distance of 0.683 mm for ultraviolet light with a wavelength of 355 nm are formed, for example, corresponding to a plurality of mask patterns 13. Then, each of the mask pattern columns 15 and each of the microlenses 14 are formed so as to be shifted in the arranging direction by a dimension equal to an integral multiple of a width corresponding to the arranging direction of a plurality of mask patterns 13 in a projection image of the mask pattern 13 on the object to be exposed 8.

Figure 3:
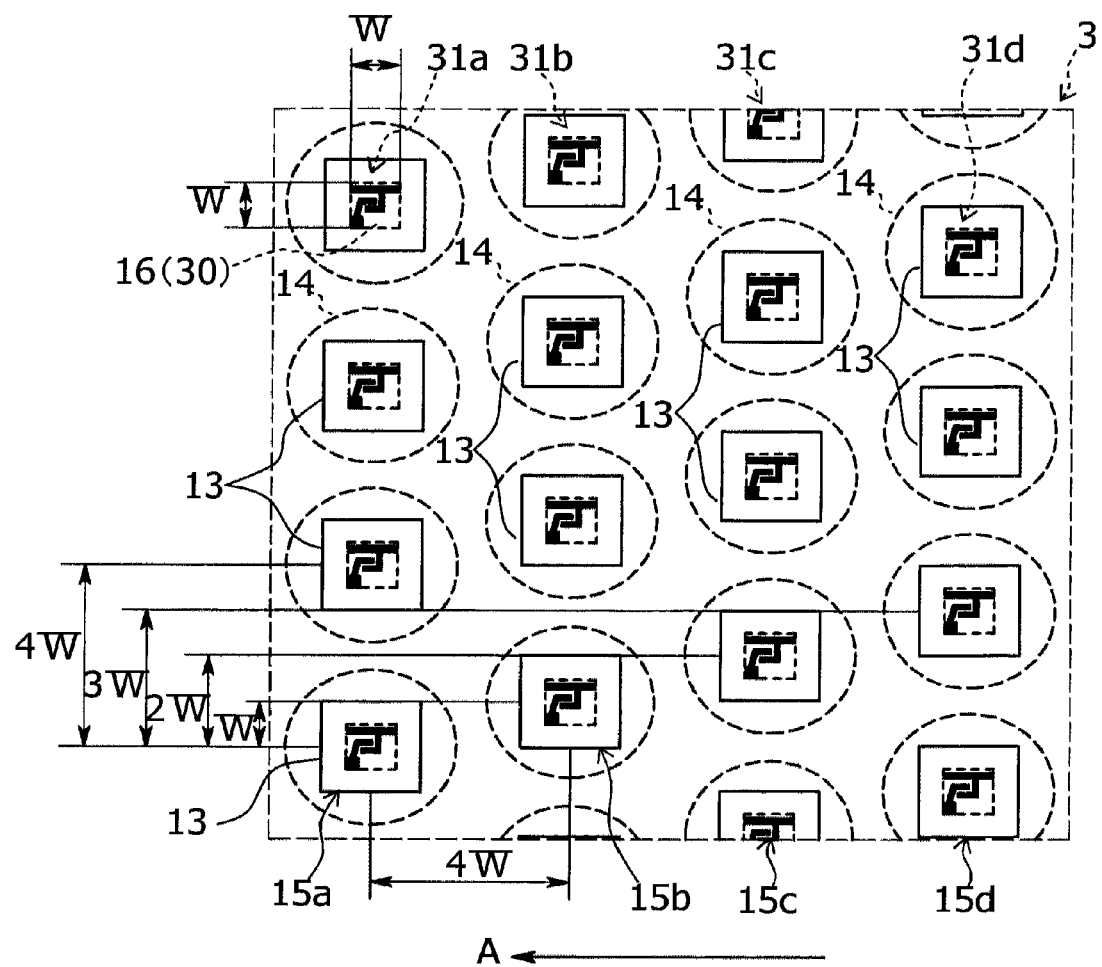
FIG. 3 is a partially enlarged plane view of the photomask.

In this embodiment, the photomask 3 is obtained, when, as illustrated in FIG. 3, a size of a projection image 16 (corresponding to an exposure pattern 30 to be described later (refer to FIG. 5)) of the mask pattern 13 on the object to be exposed 8 is a square, one side of which has a length of W, for example, by forming a plurality of mask patterns 13 of each mask pattern column 15 at a 4 W pitch, by forming second, third, and fourth mask pattern columns 15b, 15c, and 15d behind a first mask pattern column 15a located downstream in the conveying direction so as to be shifted from the first mask pattern column 15a by W, 2 W, and 3 W, respectively, in the arranging direction of the mask patterns 13 of each of the mask pattern columns 15 (direction substantially orthogonal to the arrow A), and by forming the first to fourth mask pattern columns 15a to 15d so as to be parallel to one another at the 4 W pitch. Furthermore, as illustrated in FIG. 2A, three groups of the first to fourth mask pattern columns 15a to 15d are formed so as to be arranged such that the mask pattern columns 15 are parallel to one another. Therefore, one exposure pattern is formed by multiple exposure of a plurality of mask patterns 13.

Furthermore, on the chrome (Cr) film 12 of the photomask 3, as illustrated in FIG. 2A, an elongated opening is formed away from the first mask pattern column 15a by a distance D so as to be substantially parallel to each of the mask pattern columns 15 on a side of the pattern forming area 10. The opening is the eyehole 17 through which a surface of the object to be exposed 8 is observable by the imaging device 5 to be described later.

Then, as illustrated in FIG. 1, the photomask 3 is positioned to be fixed on the mask stage 2 such that the microlens 14 is on a side of the object to be exposed 8 and the eyehole 17 is located upstream in the conveying direction (arrow A direction) of the object to be exposed 8.

The exposure optical system 4 is provided above the mask stage 2. The exposure optical system 4 is configured to apply uniform light L1 to the photomask 3 and is provided with a light source 18, a rod lens 19, and a condenser lens 20.

The light source 18 is configured to radiate the ultraviolet light of 355 nm, for example, and is a flashlamp, an ultraviolet-light-emitting laser and the like, of which lighting is controlled by the controlling device 7 to be described later. Furthermore, the rod lens 19 is located in front of a radiating direction of the light L1 radiated from the light source 18 for uniformizing brightness distribution in a cross section orthogonal to a light axis of the exposure optical system 4 of the light L1. Meanwhile, device for uniformizing the brightness distribution of the light L1 is not limited to the rod lens 19, and a light pipe and another well-known device may also be used. The condenser lens 20 is provided such that an anterior focal point thereof is on an output end face 19a of the rod lens 19 and is configured to make the light L1 emitted from the rod lens 19 parallel light to be applied to the photomask 3.

The imaging device 5 is provided upstream of the exposure optical system 4, in the conveying direction indicated by the arrow A of the object to be exposed 8. The imaging device 5 is configured to simultaneously capture an image of a reference position of the functional pattern being a positioning reference formed on the object to be exposed 8 and a reference mark formed in the eyehole 17 of the photomask 3 at a position upstream of an exposure position by the photomask 3 in the conveying direction. The imaging device 5 is a line camera obtained by arranging light-receiving devices in a linear manner in the direction substantially orthogonal to the conveying direction (arrow A direction) of the object to be exposed 8 in the plane parallel to the upper surface of the stage 9 and is arranged such that a longitudinal central axis thereof conforms to the longitudinal central axis of the eyehole 17 of the photomask 3. Meanwhile, in FIG. 1, a reference sign 21 denotes a total reflection mirror, which bends a light path of the imaging device 5.

The illuminating device 6 is provided below the stage 9 of the conveying device 1 corresponding to an imaging area of the imaging device 5. The illuminating device 6 is configured to apply illumination light composed of visible light obtained by filtering out the ultraviolet light to the object to be exposed 8, from a lower surface side to thereby make the functional pattern formed on the surface of the object to be exposed 8 observable by the imaging device 5. The illuminating device 6 is a halogen lamp and the like, for example. Meanwhile, the illuminating device 6 may be provided above the stage 9 as epi illumination.

Figure 4:
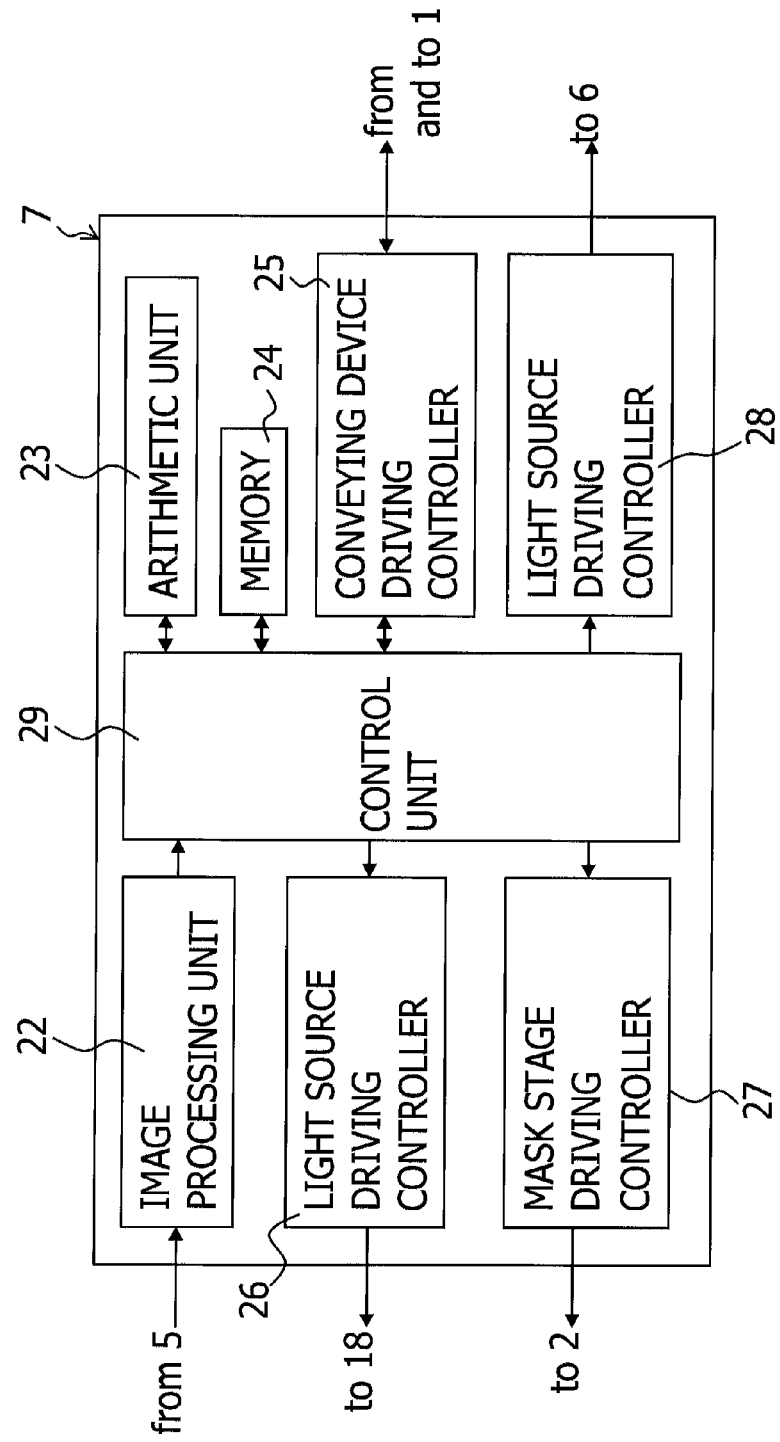
FIG. 4 is a block diagram illustrating a configuration of controlling device of the exposure apparatus.

The controlling device 7 is provided so as to be connected electrically to the conveying device 1, imaging device 5, light source 18, mask stage 2, and illuminating device 6. The controlling device 7 is configured to control to form the exposure pattern 30 corresponding to a plurality of mask patterns 13 of the photomask 3 to be superimposed on the functional pattern formed on the object to be exposed 8 by intermittently applying exposure light L2 to the object to be exposed 8 through the photomask 3 while conveying the object to be exposed 8 in one direction. As illustrated in FIG. 4, the controlling device 7 is provided with an image processing unit 22, an arithmetic unit 23, a memory 24, a conveying device driving controller 25, a light source driving controller 26, a mask stage driving controller 27, an illuminating device driving controller 28, and a controlling unit 29.

The image processing unit 22 is configured to perform image processing of an captured image of the surface of the object to be exposed 8 and the reference mark of the photomask 3 obtained by the imaging device 5 to detect the reference position set in advance in the functional pattern on the object to be exposed 8 and the position of the reference mark of the photomask 3.

Furthermore, the arithmetic unit 23 calculates a distance between the reference position on the object to be exposed 8 and the position of the reference mark of the photomask 3 which are detected by the image processing unit 22, compares a result with a target value stored in the memory 24 to be described later, and outputs difference therebetween to the mask stage driving controller 27 as a correction value, and the arithmetic unit 23 inputs an output of the position sensor of the conveying device 1 to calculate the moving distance of the stage 9 and compares the result with an arrangement pitch W in the arrow A direction (conveying direction) of the functional pattern of the object to be exposed 8 stored in the memory 24 to output a lighting instruction to turn on the light source 18 to the light source driving controller 26 each time the stage 9 moves by a distance W.

Furthermore, the memory 24 is configured to temporarily store an arithmetic result by the arithmetic unit 23 and store a moving speed V of the stage 9, the target value of the distance between the reference position on the object to be exposed 8 and the position of the reference mark of the photomask 3, and another initial setting value.

Furthermore, the conveying device driving controller 25 is configured to move the stage 9 of the conveying device 1 in the direction indicated by the arrow A at a constant speed. The conveying device driving controller 25 inputs an output of the speed sensor of the conveying device 1 to be compared with the moving speed of the stage 9 stored in the memory 24 and controls the conveying device 1 such that the both of them conform to each other.

Then, the light source driving controller 26 is configured to intermittently turn on the light source 18 and this transmits a driving signal to the light source 18 according to the lighting instruction input from the arithmetic unit 23.

Furthermore, the mask stage driving controller 27 is configured to move the mask stage 2 and the imaging device 5 in an integrated manner in the direction substantially orthogonal to the conveying direction indicated by the arrow A. The mask stage driving controller 27 controls movement of the mask stage 2 based on the correction value input from the arithmetic unit 23.

Furthermore, the illuminating device driving controller 28 is configured to turn on and turn off the illuminating device 6. The illuminating device driving controller 28 controls to turn on the illuminating device 6 when an exposure start switch is turned on and to turn off the same when entire exposure on the object to be exposed 8 is finished. The controlling unit 29 mediates between components to control such that the components appropriately drive.

Next, operation of the exposure apparatus thus configured is described. Meanwhile, a case in which square exposure patterns 30, one side of which is set to W, are formed vertically and horizontally at the arrangement pitch W is herein described.

First, operating device not illustrated including a keyboard and the like, is operated to input the moving speed V of the stage 9, the moving distance of the stage 9 from a start to an end of the exposure, power and lighting time of the light source 18, the distance D between the first mask pattern column 15 and the eyehole 17 of the photomask 3, the arrangement pitch W in the arrow A direction (conveying direction) of the functional patterns formed on the object to be exposed 8, the target value of the distance between the reference position set in advance in the functional pattern of the object to be exposed 8 and the reference mark formed on the photomask 3 and the like, and store them in the memory 24, and initial setting is performed.

Next, the object to be exposed 8 to the surface of which a photosensitive resin is applied is provided to be positioned at a predetermined position on the stage 9 with the applied surface up. When the exposure start switch not illustrated is turned on, the conveying device driving controller 25 of the controlling device 7 is activated and moves the stage 9 in the arrow A direction at the speed V. At that time, the conveying device driving controller 25 inputs the output of the speed sensor of the conveying device 1 to be compared with the speed V stored in the memory 24 so as to control the conveying device 1 such that the moving speed of the stage 9 becomes V. Furthermore, when the exposure start switch is turned on, the illuminating device driving controller 28 is activated to turn on the illuminating device 6. At the same time, the imaging device 5 is activated to start capturing an image.

The object to be exposed 8 is conveyed in accordance with the movement of the stage 9, and when the functional pattern located downstream in the conveying direction (arrow A direction) of the functional patterns formed on the object to be exposed 8 reaches the imaging area of the imaging device 5, the imaging device 5 captures images of the functional pattern through the eyehole 17 of the photomask 3 and at the same time, captures images of the reference mark of the photomask 3. Then, the imaging device 5 outputs an electric signal of the captured image to the image processing unit 22 of the controlling device 7.

The image processing unit 22 performs the image processing of the electric signal of the captured image input from the imaging device 5, detects the reference position set in advance in the functional pattern of the object to be exposed 8 and the position of the reference mark of the photomask 3, and outputs positional data to the arithmetic unit 23.

Based on the positional data of the reference position and the position of the reference mark of the photomask 3 which are input from the image processing unit 22, the arithmetic unit 23 calculates of the distance between the both of them, and compares the calculated distance with the target value of the distance therebetween read from the memory 24 to output difference therebetween to the mask stage driving controller 27 as the correction value.

The mask stage driving controller 27 moves the mask stage 2 in the direction substantially orthogonal to the arrow A direction (conveying direction) in the plane parallel to the surface of the stage 9 by the correction value input from the arithmetic unit 23 and positions the object to be exposed 8 and the photomask 3. Meanwhile, the operation is continuously performed during exposure operation to an entire surface of the object to be exposed 8 and positional shift due to yawing of the object to be exposed 8 in the direction orthogonal to the arrow A is inhibited.

Furthermore, when the image processing unit 22 performs the image processing of the electric signal of the captured image input from the imaging device 5 and the functional pattern located downstream in the conveying direction (arrow A direction) of the object to be exposed 8 is detected, the arithmetic unit 23 calculates the moving distance of the stage 9 from a point in time at which the functional pattern is detected based on the output of the position sensor of the conveying device 1 to be compared with the distance D between the first mask pattern column 15a and the eyehole 17 of the photomask 3 stored in the memory 24. When the moving distance of the stage 9 conforms to the distance D, the arithmetic unit 23 outputs the lighting instruction to turn on the light source 18 to the light source driving controller 26. The light source driving controller 26 outputs the driving signal to the light source 18 according to the lighting instruction. According to this, the light source 18 is turned on with predetermined power for predetermined time according to the initial setting value.

Figure 5:
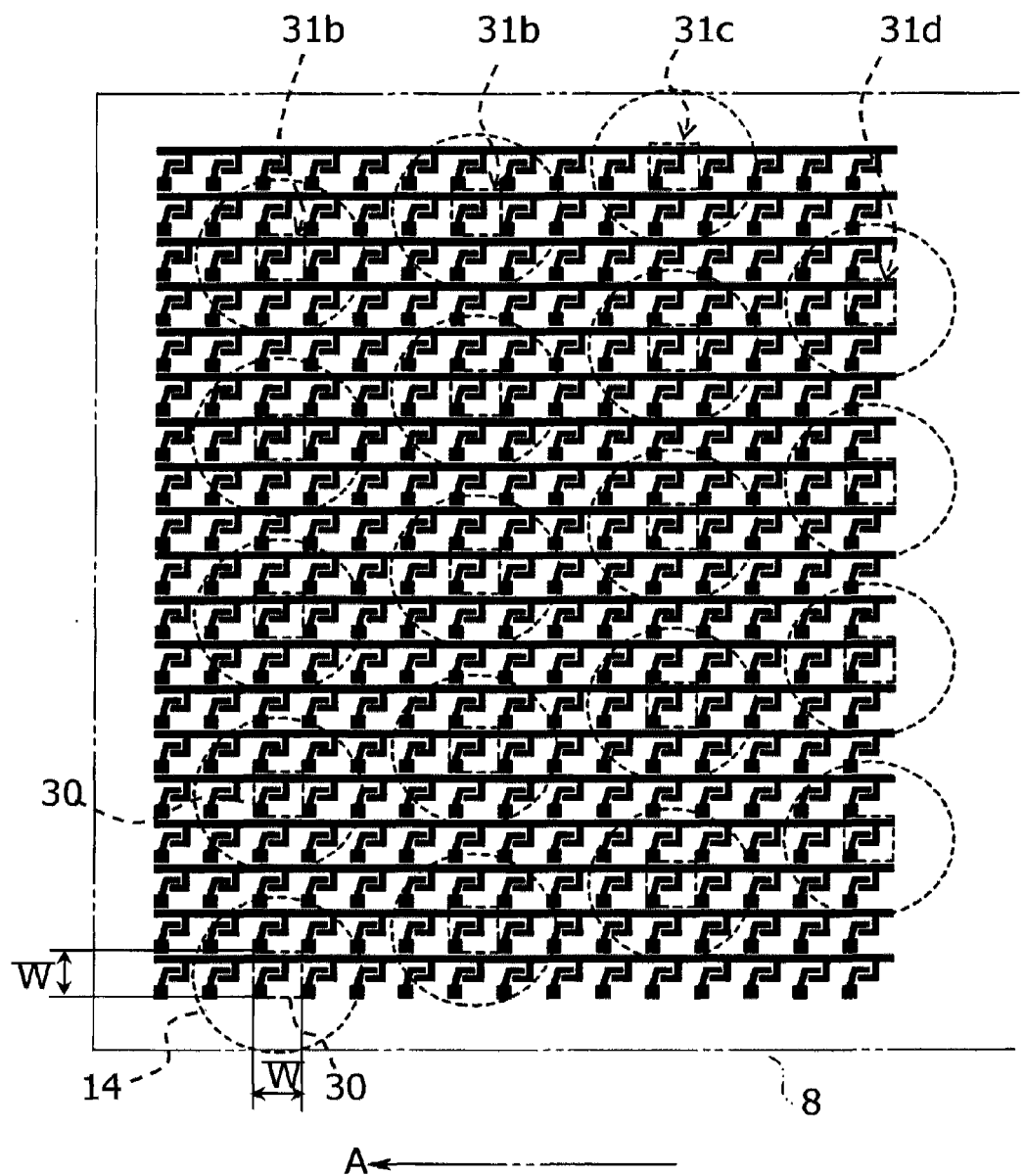
FIG. 5 is a plane view illustrating an exposure pattern formed on an object to be exposed by using the photomask.

The ultraviolet light L1 radiated from the light source 18 is made the parallel light by the condenser lens 20 after the brightness distribution thereof is uniformized by the rod lens 19 to be applied to the photomask 3. The exposure light L2, which passes through the photomask 3, is focused on the object to be exposed 8 by the microlens 14 and projects a reduced mask pattern 13 of the photo mask 3 as illustrated in FIG. 3, thereby forming the square exposure pattern 30, one side of which is set to W, on the object to be exposed 8 as illustrated in FIG. 5.

According to this, as illustrated in FIG. 3, a first exposure pattern column 31a is formed corresponding to the first mask pattern column 15a, a second exposure pattern column 31b is formed corresponding to the second mask pattern column 15b so as to be shifted by W in the direction orthogonal to the arrow A direction (conveying direction) from the first exposure pattern column 31a, a third exposure pattern column 31c is formed corresponding to the third mask pattern column 15c so as to be shifted by 2 W in the direction orthogonal to the arrow A direction (conveying direction) from the first exposure pattern column 31a, and a fourth exposure pattern column 31d is formed corresponding to the fourth mask pattern column 15d so as to be shifted by 3 W in the direction orthogonal to the arrow A direction (conveying direction) from the first exposure pattern column 31a.

Furthermore, the arithmetic unit 23 compares the moving distance of the stage 9 obtained based on the output of the position sensor of the conveying device 1 with the arrangement pitch W in the arrow A direction (conveying direction) of the functional pattern formed on the object to be exposed 8 of the initial setting values stored in the memory 24. When the moving distance and the arrangement pitch W conform to each other, the arithmetic unit 23 outputs the lighting instruction of the light source 18 to the light source driving controller 26. According to this, the light source 18 is turned on with predetermined power for predetermined time according to the initial setting value.

The ultraviolet light L1 radiated from the light source 18 is applied to the photomask 3 as in the above-described case. The exposure light L2, which passes through the photomask 3, projects the reduced mask pattern 13 of the photo mask 3 on the object to be exposed 8 as in the abovementioned case, thereby forming the square exposure pattern 30, one side of which has a length of W, on the object to be exposed 8. Hereinafter, the light source 18 is turned on for predetermined time each time the stage 9 moves by the distance W and the exposure pattern 30 is formed, and as illustrated in FIG. 5, it is possible to form the exposure patterns 30 on the entire surface of the object to be exposed 8 by complementing the space between a plurality of exposure patterns 30 formed by the first mask pattern column 15a located downstream in the conveying direction (arrow A direction) of the object to be exposed 8 with a plurality of exposure patterns 30 by the subsequent second to fourth mask pattern columns 15b to 15d.

Figure 6:
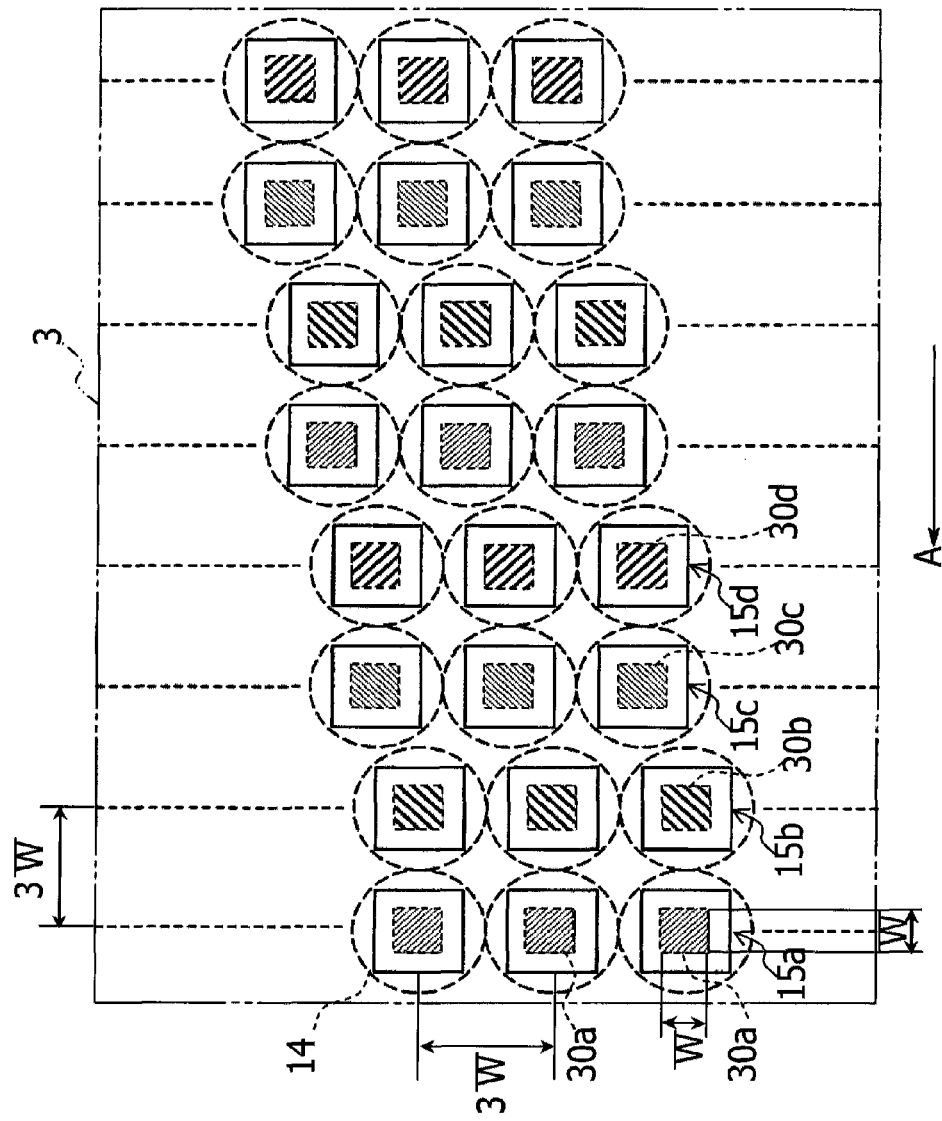
FIG. 6 is a plane view schematically illustrating another example of formation of the photomask.

FIG. 6 is an enlarged plane view of a substantial part illustrating another example of formation of the photomask 3 in which unit exposure patterns 30s of which shape is large indicated by being enclosed by a broken line in FIG. 7 may be formed so as to be arranged vertically and horizontally.

In this case, when a first exposure pattern 30a formed by the exposure by the first mask pattern column 15a located downstream in the conveying direction (arrow A direction) has a square shape, one side of which has the length of W, for example, the second mask pattern column 15b for forming a second exposure pattern 30b by the exposure immediately behind the first exposure pattern 30a in the conveying direction indicated by the arrow A (refer to FIG. 7) is provided on the photomask 3 with a shift amount of "0" in the direction substantially orthogonal to the arrow A direction behind the first mask pattern column 15a. Furthermore, behind the second mask pattern column 15b, the third mask pattern column 15c for forming a third exposure pattern 30c by the exposure to the immediate right of the first exposure pattern 30a in the arrow A direction (refer to FIG. 7) is provided so as to be shifted by W in the direction substantially orthogonal to the arrow A from the first mask pattern column 15a. Then, behind the third mask pattern column 15c, the fourth mask pattern column 15d for forming a fourth exposure pattern 30d by the exposure immediately behind the third exposure pattern 30c in the conveying direction indicated by the arrow A (refer to FIG. 7) is provided so as to be shifted by W in the direction substantially orthogonal to the arrow A from the first mask pattern column 15a. Furthermore, behind the fourth mask pattern column 15d, the mask pattern columns formed of the same combination as the first to fourth mask pattern columns 15a to 15d are provided so as to be shifted by 2 W in the direction substantially orthogonal to the arrow A direction from the first mask pattern column 15a. Then, the first to fourth mask pattern columns 15a to 15d are formed at the arrangement pitch of 3 W, for example, in the arrow A direction.

In a case in which the photomask 3 thus formed is used, the exposure may be performed by intermittently turning on the light source 18 each time the object to be exposed 8 moves in the arrow A direction by the distance of 2 W. According to this, as illustrated in FIG. 7, it is possible to form the exposure patterns 30 on the entire surface of the object to be exposed 8 by complementing the space between a plurality of first exposure patterns 30a formed by the first mask pattern column 15a with the exposure pattern 30 by the subsequent mask pattern column 15.

In this case, the unit exposure pattern 30s is formed by the first to fourth exposure patterns 30a to 30d as indicated by being enclosed by the broken line in FIG. 7 and the unit exposure patterns 30s are formed so as to be arranged vertically and horizontally. According to this, when the exposure patterns of which shape is large are formed so as to be arranged vertically and horizontally at a predetermined pitch, it is possible to form the exposure pattern by dividing the same into a plurality of minute patterns.

Meanwhile, an order of arrangement of the first to fourth mask pattern columns 15a to 15d is not limited to the above-described one and may be appropriately changed. Furthermore, the arrangement pitch and exposure timing of each mask pattern column are appropriately set according to the pitch of the pattern formed in advance on the object to be exposed 8.

Although a case in which the photomask 3 is obtained by forming a plurality of mask patterns 13 on one surface 11a of the transparent substrate 11 and by forming a plurality of microlenses 14 on the other surface 11b of the transparent substrate 11 is described in this embodiment, the present invention is not limited to this, and the photomask 3 may be formed by stacking the substrate for mask on one surface of which a plurality of mask patterns 13 are formed, on the substrate for lens on one surface of which a plurality of microlenses 14 are formed such that a plurality of mask patterns 13 and a plurality of microlenses 14 correspond to each other.

What is claimed is:

1. An exposure apparatus, which forms an exposure pattern on functional patterns formed on a surface of an object to be exposed corresponding to a plurality of mask patterns formed on a photomask by intermittently applying exposure light to the object to be exposed through the photomask each time the object to be exposed moves by a distance equal to an arrangement pitch of the functional patterns in a conveying direction while conveying the object to be exposed in the conveying direction, wherein the photomask is provided with a plurality of mask pattern columns formed by arranging the plurality of mask patterns in a line at a predetermined pitch in a direction substantially orthogonal to the conveying direction of the object to be exposed and formed at a pitch equal to an integral multiple of the arrangement pitch of the functional patterns in the same direction as the conveying direction of the object to be exposed, and a plurality of microlenses formed on a side of the object to be exposed corresponding to the mask patterns of the plurality of mask pattern columns to project reduced mask patterns on the object to be exposed, in which a subsequent mask pattern column and the microlenses corresponding to the column are formed so as to be shifted by a predetermined dimension in an arranging direction of the plurality of mask patterns such that it is possible to perform exposure by complementing a space between a plurality of exposure patterns formed by the mask pattern column located downstream in the conveying direction of the object to be exposed with a plurality of exposure patterns formed by the subsequent mask pattern column.

2. The exposure apparatus according to claim 1, wherein the subsequent mask pattern column and the microlenses corresponding to the column are formed so as to be shifted in the arranging direction by a dimension equal to an integral multiple of a width corresponding to the arranging direction of the plurality of mask patterns in a projection image of the mask patterns on the object to be exposed.

3. A photomask used in an exposure apparatus which forms an exposure pattern by intermittently applying exposure light to an object to be exposed each time the object to be exposed moves by a distance equal to an arrangement pitch of functional patterns in a conveying direction, the functional patterns being formed on a surface of the object to be exposed while conveying the object to be exposed in the conveying direction, comprising:

a plurality of mask pattern columns formed by arranging a plurality of mask patterns in a line at a predetermined pitch in a direction substantially orthogonal to the conveying direction of the object to be exposed, and formed at a pitch equal to an integral multiple of the arrangement pitch of the functional patterns in the same direction as the conveying direction of the object to be exposed; and a plurality of microlenses formed on a side of the object to be exposed corresponding to the mask patterns of the plurality of mask pattern columns to project reduced mask patterns on the object to be exposed, wherein a subsequent mask pattern column and the microlenses corresponding to the column are formed so as to be shifted by a predetermined dimension in an arranging direction of the plurality of mask patterns such that it is possible to perform exposure by complementing a space between a plurality of exposure patterns formed by the mask pattern column located downstream in the conveying direction of the object to be exposed with a plurality of exposure patterns formed by the subsequent mask pattern column.

4. The photomask according to claim 3, wherein the subsequent mask pattern column and the microlenses corresponding to the column are formed so as to be shifted in the arranging direction by a dimension equal to an integral multiple of a width corresponding to the arranging direction of the plurality of mask patterns in a projection image of the mask patterns on the object to be exposed.

5. The photomask according to claim 3, wherein the plurality of mask patterns are formed on one surface of a transparent substrate and the plurality of microlenses are formed on the other surface of the transparent substrate.

6. The photomask according to claim 3 formed by stacking a substrate for mask on one surface of which the plurality of mask patterns are formed, on a substrate for lens on one surface of which the plurality of microlenses are formed such that the plurality of mask patterns and the plurality of microlenses correspond to each other.

\* \* \* \* \*